United States Patent [19]

Tzou

[11] Patent Number: 4,736,387
[45] Date of Patent: Apr. 5, 1988

[54] QUANTIZING APPARATUS

[75] Inventor: Kou-Hu Tzou, Bedford, Mass.

[73] Assignee: GTE Laboratories Incorporated, Waltham, Mass.

[21] Appl. No.: 845,286

[22] Filed: Mar. 28, 1986

[51] Int. Cl.$^4$ ............................................ H04B 14/04
[52] U.S. Cl. .................................... 375/26; 340/347 C
[58] Field of Search ...................... 375/25, 26; 358/13; 340/347 AD, 347 C, 347 M

[56] References Cited

U.S. PATENT DOCUMENTS

| | | | |
|---|---|---|---|
| 3,382,438 | 5/1968 | Geller | 375/26 |
| 3,699,446 | 10/1972 | Sainte-Beuve | 375/26 |
| 3,927,309 | 12/1975 | Fujiwara et al. | 340/347 AD |
| 4,316,178 | 2/1982 | Shibayama et al. | 340/347 DA |
| 4,348,768 | 9/1982 | Svala | 340/347 C |
| 4,363,024 | 12/1982 | Brokav | 340/347 AD |
| 4,381,495 | 4/1983 | Hotta et al. | 340/347 DA |

OTHER PUBLICATIONS

Henry & Wooley "Per-channel Codecs for PCM Telecommunications" 1978 IEEE International Solid State Circuit Conference Feb. 15-17, 1978.
Jayant & Noll "Digital Coding of Waveforms—Principle and Applications of Speech and Video, Prentice Hall, Inc. 1984 pp. 667–668.

Primary Examiner—Robert L. Griffin
Assistant Examiner—Stephen Chin
Attorney, Agent, or Firm—David M. Keay

[57] ABSTRACT

Quantizing apparatus for producing binary quantized values of increasingly closer approximation to a real-valued signal being quantized. A look-up table of threshold values are stored in a memory which is addressed by a shift register. A comparator compares a selected threshold value from the memory with the real-valued signal and produces a bit depending on which is greater. The bit is entered in the shift register causing an appropriate threshold value to be selected for the next comparison cycle with the real-valued signal. Over successive cycles the accumulated bits provide a quantized representation of the real-valued signal of increasing precision. The bits are dequantized to provide a reconstructed value by dequantizing apparatus having a memory containing a look-up table of reconstructed values. The memory is addressed by a shift register which accumulates the bits as they are received. A more precise reconstructed value is produced by the memory as the contents of the shift register accumulates more bits.

8 Claims, 2 Drawing Sheets

QUANTIZING APPARATUS

BACKGROUND OF THE INVENTION

This invention relates to the quantizing of a real value to an approximate binary representation. More particularly, it is concerned with apparatus for obtaining binary quantized values of increasingly closer approximation to the real value being quantized.

Quantization is the process of representing a sample, possibly an infinitely valued analog sample, by an approximate value from a finite set of allowed values. The sample is compared with a set of quantization threshold levels corresponding to a set of allowed reconstruction levels, and an output symbol, usually in the binary format, is produced to indicate which pair of threshold levels the sample is located between. To reconstruct the sample, or dequantize, the output symbol in binary format is employed to retrieve the closest approximate reconstructed value from a set of allowed values.

In some applications, such as variable-rate transmission and progressive transmission for video and speech signals, embedded quantization is desired. The embedded quantizer allows a coarse approximation of the sample to be transmitted initially and the approximation to be improved successively as additional information bits become available. With embedded quantization the previous output is not altered as it is changed from coarse resolution to finer resolution. For example, if ($b_1$, $b_2$, $b_3$) is the binary output from a 3-bit quantizer, the output symbol for the 4-bit quantizer should be ($b_1$, $b_2$, $b_3$, x), where "x" is a new binary digit appended to the previous output. In other words, the output symbol of the 3-bit quantizer is embedded in that of the 4-bit quantizer. Therefore, a partial output from a quantizer can be used to make a coarse approximation of the input sample and, also, additional information bits can be appended to an existing output to achieve finer approximation.

SUMMARY OF THE INVENTION

A simple, efficient quantizing apparatus for quantizing real-valued input signals in varying degrees of quantization is provided by apparatus in accordance with the present invention. The apparatus includes an input connection for receiving a real-valued input signal. A threshold storage means stores a table of threshold values and produces a threshold value signal representing a selected one of the threshold values. The input connection and the threshold storage means are coupled to a comparator means which produces at an output connection a binary output signal of one binary value when the real-valued input signal is greater than the selected one of the threshold values and produces a binary output signal of the opposite binary value when the real-value input signal is less than the selected one of the threshold values. Register means are coupled to the output connection and to the threshold storage means for storing binary output signals produced by the comparator means. The threshold storage means operates to produce a threshold value signal representing a selected one of the threshold values which is determined by the contents of the register means. The apparatus includes means for causing the threshold storage means to produce an initial threshold value signal whereby the comparator means produces a binary output signal of one or of the opposite binary value depending upon the real-valued input signal and the selected threshold value.

The apparatus also includes means for entering each binary output signal produced at the output connection into the register means whereby a binary quantized representation of the real-valued input signal is produced which increases in precision.

A system in accordance with the present invention for quantizing and dequantizing a real-valued signal includes the foregoing quantizing apparatus together with dequantizing apparatus which comprises an input connection for receiving the binary output signals from the quantizing apparatus. A reconstruction storage means stores a table of reconstructed values of real-valued signals and produces at an output connection a reconstructed value signal representing a selected one of the reconstructed values. The input connection and the reconstruction storage means are coupled to a register means which stores binary output signals as they are received. The reconstruction storage means produces a reconstructed value at the output connection thereof as determined by the contents of said register means. Thus, a reconstructed approximation of the real-valued input signal is produced which increases in precision with increasing binary output signals.

For a better understanding of the present invention, together with other and further objects, advantages, and capabilities thereof, reference is made to the following disclosure and appended claims in connection with the above-described drawings.

DETAILED DESCRIPTION

Figure 1:
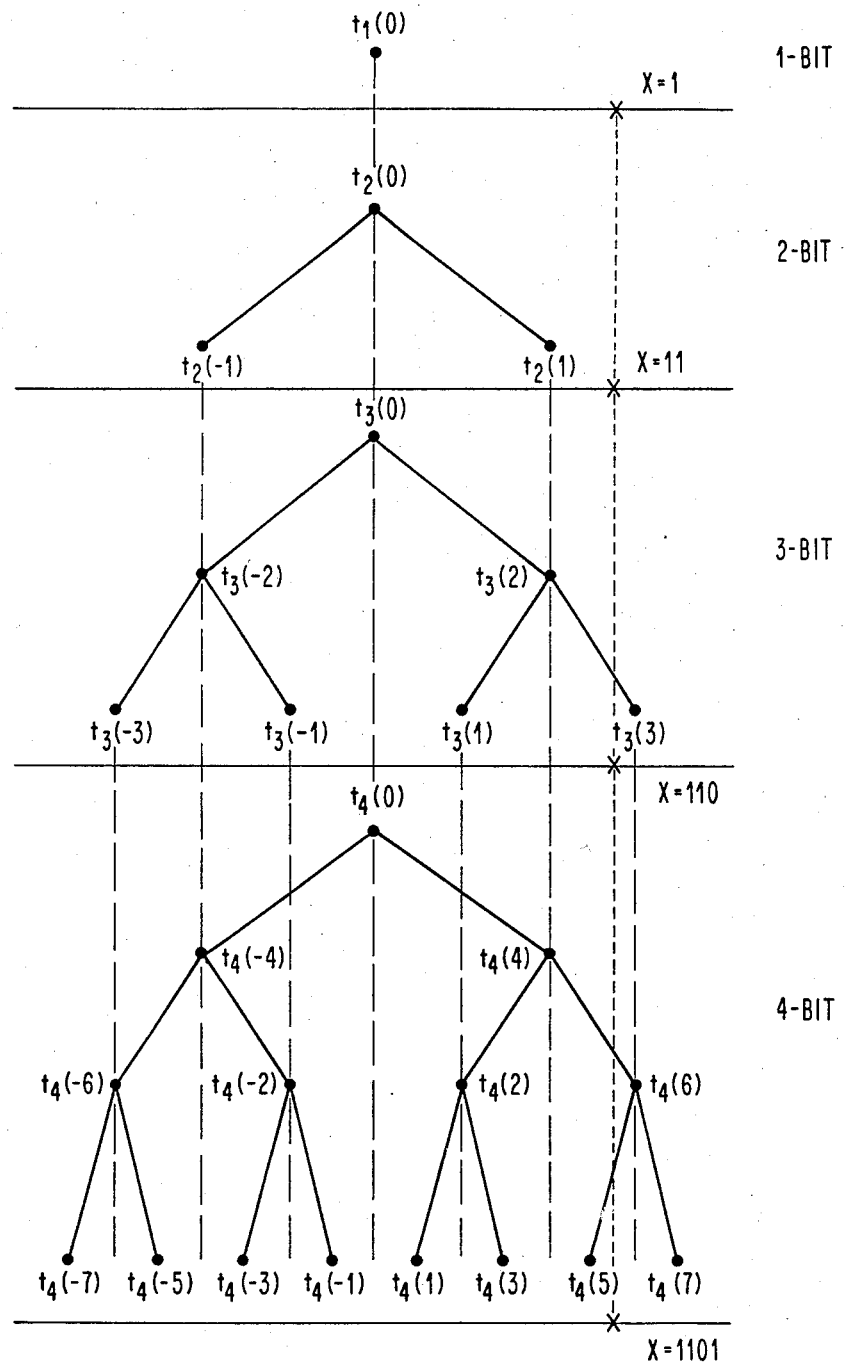
FIG. 1 is a diagram of threshold levels aligned to provide an embedded quantizing scheme for a 1-bit to 4-bit quantizing apparatus in accordance with the present invention.

FIG. 1 illustrates binary tree representations of the threshold levels of 1-bit to 4-bit embedded quantizers. The quantization procedure may be explained by following the binary trees of FIG. 1. Quantization starts from the root of a tree, compares the real-valued input signal with the threshold value at the node, produces a bit, advances one level down the tree, and repeats the procedure until the appropriate number of bits of quantization have been produced. If the input data sample is greater than the threshold value at a node, a "1" is produced and the right branch of the node is followed to reach the next threshold level to be compared. If the input data sample is less than the threshold level, a "0" is produced and the left branch of the node is followed to reach the next threshold level to be compared with the input sample.

Assuming that the input marked as an "x" in FIG. 1 is to be quantized by 1, 2, 3, and 4-bit quantizers as illustrated in FIG. 1. For 1-bit quantization the value "x" is greater than the $t_1(0)$ threshold level and, therefore, a "1" is produced. For 2-bit quantization since "x" is greater than the first threshold level $t_2(0)$, a "1" is produced and the right branch is followed to the $t_2(1)$ node. Since "x" is greater than the $t_2(1)$ threshold level another "1" is produced. Thus, for 2-bit quantization the symbol is "11".

For 3-bit quantization the value of "x" is greater than the $t_3(0)$ threshold level. A "1" is produced and the right branch is followed to the $t_3(2)$ threshold value which is the same as, or is aligned with, the $t_2(1)$ threshold level for 2-bit quantization. Since the value of "x" is greater than the $t_3(2)$ threshold value, a "1" is produced and the right branch is followed to the next node which is the $t_3(3)$ threshold value. Since the value of "x" is less than this threshold level, a "0" is produced. Therefore, "x" is represented by "110" for a 3-bit quantizing scheme.

In the 4-bit quantization procedure as illustrated, the first three threshold levels $t_4(0)$, $t_4(4)$, and $t_4(6)$ are aligned with threshold levels $t_3(0)$, $t_3(2)$, and $t_3(3)$, respectively, for 3-bit quantization. The bits produced are thus "1", "1", and "0." Since the value of "x" is less than the threshold value at $t_4(6)$ and a "0" is produced, the left branch is taken from the $t_4(6)$ node to the $t_4(5)$ threshold value. Since "x" is greater than this threshold value, a "1" is produced. Thus, 4-bit quantization produces a symbol of "1101" for the value of "x". Since the threshold levels are aligned, the quantization procedure illustrated is embedded; that is, each additional bit increases the precision of the binary representation of the real-valued sample without any change in the bits previously produced.

Figure 2:
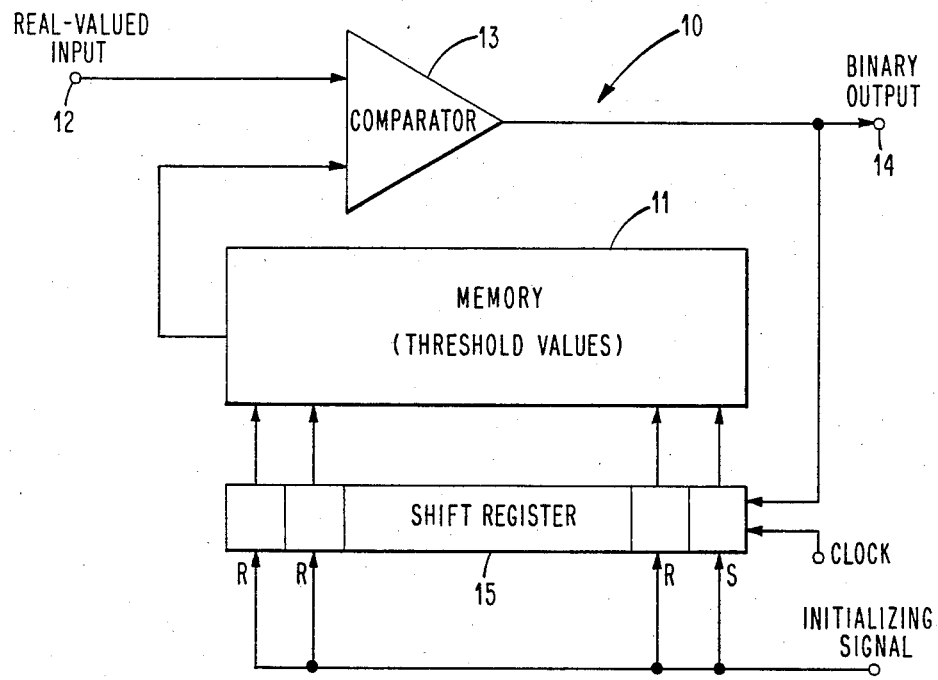
FIG. 2 is a block diagram of a quantizing apparatus in accordance with the present invention.

FIG. 2 illustrates apparatus in accordance with the present invention for quantizing a real-valued input signal with increasing precision in accordance with the scheme illustrated by the diagrams of FIG. 1. The quantizer apparatus 10 includes a memory or look-up table 11 which contains a set of stored threshold values for each of several degrees of quantization. A selected one of the threshold values from the memory 11 is compared with the real-valued input signal, which is received at an input terminal 12, in a digital comparator 13. The digital comparator 13 produces a binary "1" when the real-valued input is greater than the selected threshold value, and produces a binary "0" when the real-valued input is less. This binary output appears at an output terminal 14 to be transmitted as desired. The binary output terminal 14 is connected to a serial shift register 15 which provides address information to address the threshold values in the memory 11.

The quantizer apparatus 10 of FIG. 2 operates in the following manner to produce binary output signals which represent the real-valued input present at the input terminal 12. An initializing signal is applied to the shift register 15 to clear the shift register and to set the first stage. This address information causes the memory 11 to select a threshold value, specifically the $t_1(0)$ value, for comparing with the real-valued input signal. An appropriate "1" or "0" is produced at the output 14 of the digital comparator 13 and, therefore, at the input to the shift register 15. This bit is clocked into the shift register 15 and is available at the output terminal 14 as a 1-bit quantized symbol representing the real-valued input signal. The memory 11 is addressed by the contents of the shift register 15 containing the additional bit, and in response thereto produces a second threshold value $t_2(-1)$ or $t_2(1)$. The digital comparator 13 produces a "1" or a "0" depending upon which of the two inputs is of higher value. This bit is available at the output terminal 14 and is clocked into the shift register 15 thus increasing the contents to two bits of quantized data. A third threshold value $t_3(-3)$, $t_3(-1)$, $t_3(1)$, or $t_3(3)$ is selected, depending upon the contents of the shift register 15, for a third comparison with the real-valued input. The operating cycle is repeated depending upon the degree of quantization desired to a maximum of the number of sets of threshold values stored in the memory 11.

Figure 3:
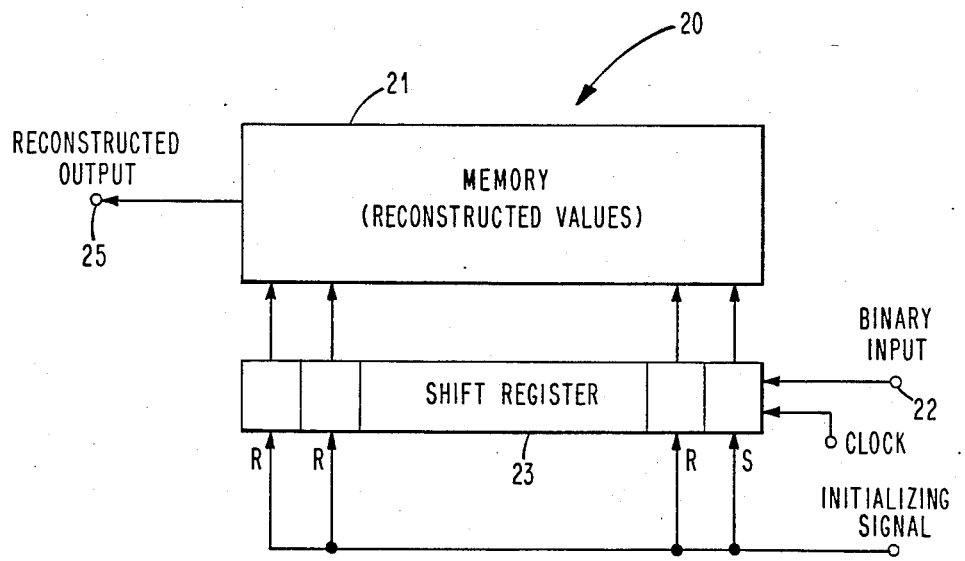
FIG. 3 is a block diagram of a dequantizing apparatus for reconstructing an approximation of the real-valued input signal by employing the binary quantized output from the quantizer apparatus of FIG. 1.

The quantized binary data may be dequantized to provide a reconstructed signal which approximates the original real-valued input with greater precision as a greater number of bits of information are available. FIG. 3 illustrates a dequantizing apparatus 20 which may be employed in conjunction with the apparatus of FIG. 2. The dequantizing apparatus 20 includes a memory or look-up table 21 of sets of reconstructed values which are calculated in conjunction with the threshold values stored in the threshold value tables of the memory 11. The apparatus includes an input terminal 22 for receiving the quantized binary information. After a shift register 23 is cleared and its first stage set, the first bit of received input data is clocked into the shift register 23. The reconstructed values in the memory 21 are addressed by the contents of the shift register 23 causing a particular one of the reconstructed values to be produced at an output terminal 25. This cycle is repeated as additional bits are received at the input terminal 22. A more precise reconstructed value is produced at the output terminal 25 as the number of bits in the shift register 23 increases.

The following is an example of the operation of a system employing the quantizing apparatus 10 of FIG. 2 and the dequantizing apparatus 20 of FIG. 3. Table 1 is a table of sets of threshold values for 1-bit, 2-bit, 3-bit, and 4-bit degrees of quantization stored in the memory 11. Table 2 is a table of associated sets of reconstructed values for 1-bit, 2-bit, 3-bit, and 4-bit degrees of quantization. Only positive values are given, the negative values being symmetric therewith. The threshold and reconstructed values are calculated for a Gaussian source and quantization is nonuniform; that is, the differences between adjacent values are not equal. Although the threshold values provide nonuniform quantization, they are aligned from set to set with additional threshold values of intermediate value added for increasing degrees of quantization.

TABLE 1

| Threshold values for 1 bit |
|---|
| 0.0000 |
| Threshold values for 2 bits |
| 0.0000, 1.0993 |
| Threshold values for 3 bits |
| 0.0000, 0.5224, 1.0993, 1.8435 |
| Threshold values for 4 bits |
| 0.0000, 0.2582, 0.5224, 0.7996, 1.0993, 1.4371, 1.8435, 2.4008 |

TABLE 2

| Reconstruction values for 1 bit |
|---|
| 0.7980 |
| Reconstruction values for 2 bits |
| 0.4968, 1.6052 |
| Reconstruction values for 3 bits |
| 0.2553, 0.7887, 1.4060, 2.2354 |
| Reconstruction values for 4 bits |
| 0.1284, 0.3881, 0.6568, 0.9423, 1.2562, 1.6180, 2.0690, 2.7326 |

Operation of the system employing the values of Tables 1 and 2 may be illustrated in conjunction with the binary tree representations of FIG. 1. Assuming in the representations of FIG. 1 a real-valued input signal "x" at the input terminal 12 of 1.5000. On initialization the memory 11 produces a threshold value of 0.0000 from Table 1, and the digital comparator 13 produces a "1" which appears at the binary output 14 and is clocked into the shift register 15. When this "1" bit is received by the dequantizing apparatus 20 of FIG. 3 and placed in the shift register 23, it addresses the memory 21 causing the reconstructed output to be 0.7980 as shown in Table 2.

The contents of the shift register 15 causes the memory 11 to produce a threshold value of 1.0993. Since the value of "x" is greater than 1.0993, the digital comparator 13 produces a "1" which is transmitted from the output terminal 14 and loaded into the shift register 15. The additional "1" bit is received at the input terminal 22 of the dequantizer 20 and placed in the shift register 23 causing the memory 21 to change its output to a value of 1.6052.

The binary data "11" stored in the shift register 15 causes the memory 11 to produce a threshold value of 1.8435. Since this value is greater than the real-valued input of 1.5000, the digital comparator 13 produces a "0" which appears at the binary output 14 and is stored in the shift register 15. When this bit is entered in the shift register 23 of the dequantizing apparatus 20, it causes the memory 21 to produce a reconstructed value of 1.4060 at the output terminal 25.

The "110" contents of the shift register 15 causes the memory 11 to produce a threshold value of 1.4371, which is compared with the real-valued input of 1.5000 causing the digital comparator 13 to produce a "1". This bit is transmitted from the output terminal 14 and placed in the shift register 15. The "1" bit is added to the contents of the shift register 23 and the stored "1101" causes the memory 21 to produce a reconstructed value of 1.6180. Thus, as can be seen, for each successive cycle of quantization an additional bit is produced which is utilized to produce a more precise reconstructed approximation of the original real-valued input signal.

While there has been shown and described what is considered a preferred embodiment of the present invention, it will be obvious to those skilled in the art that various changes and modifications may be made therein without departing from the invention as defined by the appended claims.

What is claimed is:

1. Apparatus for quantizing a signal comprising
   an input connection for receiving a real-valued input signal;
   threshold storage means for storing a table of threshold values and for producing a threshold value signal therefrom representing a selected one of said threshold values;
   comparator means coupled to said input connection and to said threshold storage means for producing at an output connection an output bit of one binary value when the real-valued input signal at the input connection is greater than the selected one of said threshold values and for producing at the output connection an output bit of the other binary value when the real-valued input signal at the input connection is less than the selected one of said threshold values;
   register means coupled to the output connection and to the threshold storage means for storing output bits from the comparator means;
   said threshold storage means being operable to produce a threshold value signal representing a selected one of said threshold values as determined by the contents of said register means;
   means for causing said threshold storage means to produce an initial threshold value signal representing a zero value;
   said comparator means being operable in response to the initial threshold value signal and to the real-valued input signal to produce a first output bit;
   said register means being operable to store said first output bit;
   said threshold storage means, said comparator means, and said register means operating to repeat the operating cycle of the threshold storage means producing a threshold value signal determined by the contents of the register means, the comparator means producing an output bit, and the register means storing the output bit to add to the contents thereof thereby to provide a binary quantized representation of the real-valued input signal with increasing precision for each repetition of the operating cycle.

2. Apparatus for quantizing a signal in accordance with claim 1 wherein
   said table of threshold values includes a plurality of N sets of threshold values, each set of threshold values of the plurality being available to be selected in order as the contents of the register means is increased from one to N bits, the particular set from which a threshold value is selected being determined by the number of bits in the register means, and the particular threshold value of the set which is selected being determined by the specific bits in the register means.

3. Apparatus for quantizing a signal in accordance with claim 1 wherein
   the threshold values of the table of threshold values stored in said threshold storage means which are available to be selected during an operating cycle are the same as the threshold values available to be selected during the preceding operating cycle with the addition of a threshold value of intermediate value between each pair of the threshold values available during the preceding operating cycle.

4. Apparatus for quantizing a signal in accordance with claim 3 wherein
   the difference in the values of adjacent threshold values in the table of threshold values available to be selected each operating cycle are nonuniform.

5. A system for quantizing and dequantizing a real-valued signal including quantizing apparatus comprising
   an input connection for receiving a real-valued input signal;
   threshold storage means for storing a table of threshold values and for producing a threshold value signal therefrom representing a selected one of said threshold values;
   comparator means coupled to said input connection and to said threshold storage means for producing at an output connection an output bit of one binary value when the real-valued input signal at the input connection is greater than the selected one of said threshold values and for producing at the output connection an output bit of the other binary value when the real-valued input signal at the input connection is less than the selected one of said threshold values;

first register means coupled to the output connection and to the threshold storage means for storing output bits from the comparator means;

said threshold storage means being operable to produce a threshold value signal representing a selected one of said threshold values as determined by the contents of said first register means;

means for causing said threshold storage means to produce an initial threshold value signal representing a zero value;

said comparator means being operable in response to the initial threshold value signal and to the real-valued input signal to produce a first output bit at the output connection;

said register means being operable to store said first output bit;

said threshold storage means, said comparator means, and said first register means operating to repeat the operating cycle of the threshold storage means producing a threshold value signal determined by the contents of the first register means, the comparator means producing an output bit at the output connection, and the first register means storing the output bit to add to the contents thereof thereby to provide a binary quantized representation of the real-valued input signal with increasing precision for each repetition of the operating cycle;

and including dequantizing apparatus comprising an input connection for receiving the output bits produced at the output connection of the comparator means of said quantizing apparatus in order as they are produced;

reconstruction storage means for storing a table of reconstructed values of real-valued signals and for producing at an output connection a reconstructed value signal therefrom representing a selected one of said reconstructed values;

second register means coupled to the input connection and to the reconstruction storage means for storing the output bits as they are received; and said reconstruction storage means being operable to produce a reconstructed value at the output connection thereof as determined by the contents of said second register means so that a reconstructed approximation of the real-valued input signal at the input connection of the quantizing apparatus is produced which increases in precision with each output bit received.

6. A system in accordance with claim 5 wherein said table of threshold values includes a plurality of N sets of threshold values, each set of threshold values of the plurality being available to be selected in order as the contents of the first register means is increased from one to N bits, the particular set from which a threshold value is selected being determined by the number of bits in the first register means, and the particular threshold value of the set which is selected being determined by the specific bits in the register means; and said table of reconstructed values includes a plurality of N sets of reconstructed values, each set of reconstructed values of the plurality being available to be selected in order as the contents of the second register means is increased from one to N bits, the particular set from which a reconstructed value is selected being determined by the number of bits in the second register means, and the particular reconstructed value of the set which is selected being determined by the specific bits in the second register means.

7. A system in accordance with claim 5 wherein the threshold values of the table of threshold values stored in said threshold storage means which are available to be selected during an operating cycle are the same as the threshold values available to be selected during the preceding operating cycle with the addition of a threshold value of intermediate value between each pair of the threshold values available during the preceding operating cycle.

8. A system in accordance with claim 7 wherein the difference in the values of adjacent threshold values in the table of threshold values available to be selected each operating cycle are nonuniform.

* * * * *